(12) United States Patent
Schubert et al.

(10) Patent No.: US 8,047,273 B2
(45) Date of Patent: Nov. 1, 2011

(54) MICRO HEAT EXCHANGER AND ITS USE AS COOLER FOR ELECTRONIC COMPONENTS

(75) Inventors: Klaus Schubert, Karlsruhe (DE);
Jürgen Brandner, Sandhausen (DE);
Ulrich Schygulla, Bruchsal (DE);
Eugen Anurjew, Karlsruhe (DE); Edgar Hansjosten, Karlsruhe (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 937 days.

(21) Appl. No.: 12/069,397

(22) Filed: Feb. 8, 2008

(65) Prior Publication Data
US 2008/0173435 A1    Jul. 24, 2008

Related U.S. Application Data

(63) Continuation-in-part of application No. PCT/EP2006/011849, filed on Dec. 8, 2006.

(30) Foreign Application Priority Data

Dec. 9, 2005  (DE) .......................... 10 2005 058 780

(51) Int. Cl.
*F28D 7/00*   (2006.01)
(52) U.S. Cl. ........................ 165/166; 165/165; 165/80.4

(58) Field of Classification Search .................. 165/80.2, 165/80.4, 80.5, 165, 166
See application file for complete search history.

(56) References Cited

U.S. PATENT DOCUMENTS

| 6,337,794 | B1 | 1/2002 | Agonafer et al. | |
|---|---|---|---|---|
| 7,111,672 | B2* | 9/2006 | Symonds | 165/165 |
| 7,201,217 | B2* | 4/2007 | Johnson et al. | 165/170 |
| 2002/0075651 | A1 | 6/2002 | Newton et al. | |
| 2004/0104010 | A1* | 6/2004 | Kenny et al. | 165/80.4 |
| 2004/0182560 | A1 | 9/2004 | Kenny et al. | |

FOREIGN PATENT DOCUMENTS

| DE | 195 36 115 | 4/1997 |
|---|---|---|
| DE | 197 34 054 | 2/1998 |

* cited by examiner

*Primary Examiner* — Teresa Walberg
(74) *Attorney, Agent, or Firm* — Klaus J. Bach

(57) ABSTRACT

In a micro heat exchanger for the transfer of high area-specific amounts of heat from a heat source to a heat transfer medium, including a heat transfer structure with an inlet- and an outlet duct structure between which a plurality of passages extend through the heat transfer structure, the inlet and outlet duct structures are arranged in alternating order in the heat transfer area in close proximity to the heat source, with the inlet and outlet duct structure and the passages interconnecting the inlet and outlet structures covering the whole heat transfer area directly adjacent the heat source.

10 Claims, 7 Drawing Sheets a)

b)

c)

d)

MICRO HEAT EXCHANGER AND ITS USE AS COOLER FOR ELECTRONIC COMPONENTS

This is a Continuation-In-Part Application of pending International Application PCT/EP2006/011849 filed Dec. 8, 2006 and claiming the priority of German application 10 2005 058 780.1 filed Dec. 9, 2005.

BACKGROUND OF THE INVENTION

The invention resides in a micro heat exchanger for the transfer of high area-specific amounts of heat by a fluid, comprising inlet and outlet structures, each having distribution volumes with passages extending therebetween for conducting fluid from the inlet to the outlet structures through the passages.

In technical processes, often energy loss-dependent heat amounts are generated which must be reliably carried away by suitable coolants. In microelectronic systems, the waste heat is generally carried away by heat conducting solid bodies and/or flows of fluid coolant for example air, oil or water.

Larger specific heat loss amount occur for example in microelectronics, micro-engineering or other micro-technical systems. The constantly increasing miniaturization of electronic components which, at the same time, become increasingly powerful, such as data processors, substantially improves the capabilities of the electronic equipment but also increases the amount of waste heat which is generated and has to be carried away. Consequently, with the increase in the specific waste heat generated also the means for reliably carrying the waste heat away, that is the means for cooling the components must be improved or further developed.

Known cooling means for microelectronics comprise bodies which are directly connected to the electronic components to be cooled and which include cooling ribs via which the heat is transferred to a fluid flowing past the ribs, preferably air. The bodies have a good heat conductivity and often a relatively high heat capacity for carrying heat away and for compensating to a certain degree for local temperature variations.

Known cooling means in micro-processing comprise micro fluid heat exchangers such as micro-cross-flow or counter-flow heat exchangers with a plurality of fluid flow passages. The fluid flow passages are often also micro-structured which, as a result of the large heat transfer area on one hand and the short heat transfer distances, provide for high specific heat transfer rates. However, such systems have—based on the principle—relatively large temperature differences over the length of the fluid passages and therefore result in a non-uniform inhomogeneous heat removal which is even increased by blockages caused in individual passages by impurities. Often such micro-structured heat exchangers have a high flow resistance and consequently cause a high pressure loss in the coolant during its flow through the micro-channels which is highly dependent on the amount of blockages of the coolant channels.

If a specific heat amount to be removed together with the miniaturization and power-consumption exceeds a certain value, known concepts rapidly reach their physical limits.

It is therefore the object of the present invention to provide a fluidic micro heat exchanger for the transfer of high area-specific amounts of heat which does not have the limitations and disadvantages of the systems referred to above and which has an especially low coolant flow resistance of the cooling medium. Preferably, the heat exchanger according to the invention should also have a specific heat removal capability which remains essentially constant over a certain heat transfer range and a temperature level which remains constant over the whole area.

The heat exchanger of the present is to be particularly suitable for cooling an electronic component.

SUMMARY OF THE INVENTION

In a micro heat exchanger for the transfer of high area-specific amounts of heat from a heat source to a heat transfer medium, including a heat transfer structure with an inlet- and an outlet duct structure between which a plurality of passages extend through the heat transfer structure, the inlet and outlet duct structures are arranged in alternating order in the heat transfer area in close proximity to the heat source, with the inlet and outlet duct structure and the passages interconnecting the inlet and outlet structures covering the whole heat transfer area directly adjacent the heat source.

The micro heat exchanger includes in each heat transfer area an inlet structure and an outlet structure for at least one heat transfer medium as well as a plurality of passages which form the only flow connection for a heat transfer medium between the inlet and the outlet structure.

The heat transfer area comprises, within the scope of the invention, alternatively to a heat transfer component, between the heat energy source and the heat transfer medium mentioned a heat transfer area, preferably an outer heat transfer surface, of the micro heat exchanger for the attachment of a component to be cooled which includes the heat energy source. The attachment may be a force-, form- or material-locking connection, wherein with a force and form-locking connection, the heat transfer is improved by a heat coupling medium such as a heat conductive fluid or a heat conductive paste. A material locking connection is formed for example by a solder or cement joint which is a material joint and is therefore similar to an integral heat transfer component if the heat transfer capabilities and heat capacities are tuned to one another.

An essential feature of the invention resides in the arrangement of the inlet and outlet structures for each heat transfer medium and the arrangement of the passages relative to each other. The above-mentioned passage structures are in alternate order intertwined and have separating walls which are bridged by the passages. Like the passage structures the separating walls extend preferably over the whole heat transfer area, wherein the passages in large numbers and in a parallel arrangement extend as far as possible into the heat transfer area. Preferably, the separating walls are relatively long and the passages are distributed over the whole length. Preferably, the separating wall has over the whole length in which it is bridged by passages a constant thickness. It is advantageous and also preferred that all the passages have the same dimensions with respect to cross-section, length and relative arrangement in the heat transfer area.

A first advantage in this arrangement resides in the fact that, with the highly branched heat transfer medium flow in the passage structures and a further, that is, even greater branching of the heat transfer medium flow in the passages, the specific area available for a heat transfer is substantially increased so that the maximum possible heat transfer to the fluid in the passages is achieved. Since, additionally, the passages extend into the heat transfer area and over the whole heat exchange area in the same way, the heat transfer takes place consequently uniformly in all the passages over the whole heat transfer area. Additional material accumulation for temperature compensation in the heat exchange area which would not only increase the heat transfer distances to, or from, the heat transfer medium and would disadvantageously not only increase the heat transfer distances to, or from, the heat exchange medium and the power losses but also increase the dimensions of the micro heat exchanger are therefore not necessary or to a substantially smaller extent.

A second advantage of such a fanning out of the heat transfer medium into a multitude of passages which are preferably short in comparison to their flow cross-sections resides in the low flow resistance of a fluid in the micro heat exchanger. Preferably, the passages and the passage structures in combination have a greater flow cross-section than the inlet and outlet areas of the micro heat exchanger and the sum of the passage cross-sections exceeds preferably even the sum of the cross-sections of the inlet and outlet ducts. Furthermore, the length of each passage does not exceed five times and preferably not twice the maximum diameter of the respective passage. It is important however, that the dimensions of the passages are so selected that an inlet flow is formed which is not hydrodynamically or thermally preformed, that is, it is not laminar. This three-dimensional non-laminar inlet flow includes in the heat transfer area a flow vector having a component normal to the heat transfer wall which increases the heat transfer between the fluid and the wall locally. The flow resistance remains in this area small because of the dimensions of the passages. If the coolant flow in the inlet and the outlet ducts is mainly laminar the heat transfer is advantageously concentrated in the passage areas.

The dimensions of the micro heat exchanger are essentially selected based on the application purpose. They are preferably adapted to the geometric dimensions of the components to be cooled such as for example an adapted micro reactor or an electronic component wherein the sizes of the passage structures, the fluid guide means, the ducts and the walls are determined by the intended application and the specific heat amounts to be transferred.

The various sizes are in practice limited primarily by the manufacturing procedures wherein however the flow through the heat exchanger passages must always be ensured. For example, small contaminants or inhomogeneities in the fluid should not lead to blockages in the fluid passages (possible passage minimum size limits). Depending on the geometric size, material and the economic restraints, for the manufacture of the structures in the micro heat exchanger mechanical cutting or stamping, erosive (for example, electrical thermal or mechanical) or chemically etching manufacturing processes, but also injection molding and deposition procedures (galvanic) known micro-structuring methods or combinations of these methods may be used.

The micro heat exchanger according to invention may also be used for controlling the temperature of chemical reactions for example in a micro-reactor, or physical or electronic processes for example, in an electronic switch, a light source (for example an incandescent lamp, discharge processes, etc.) or in a shield of a heat or refrigeration source (protective shield without tempering the source itself). The micro heat exchanger is herein attached to the outside at one, or at several or at all sides of a respective device for performing the above procedures or it is incorporated into that device, wherein the respective heat transfer area with the passages can be connected not only at one side but at both sides to a duct structure.

The invention will be described below on the basis of exemplary embodiments with reference to the accompanying drawings.

DESCRIPTION OF PARTICULAR EMBODIMENTS

Figure 1A:
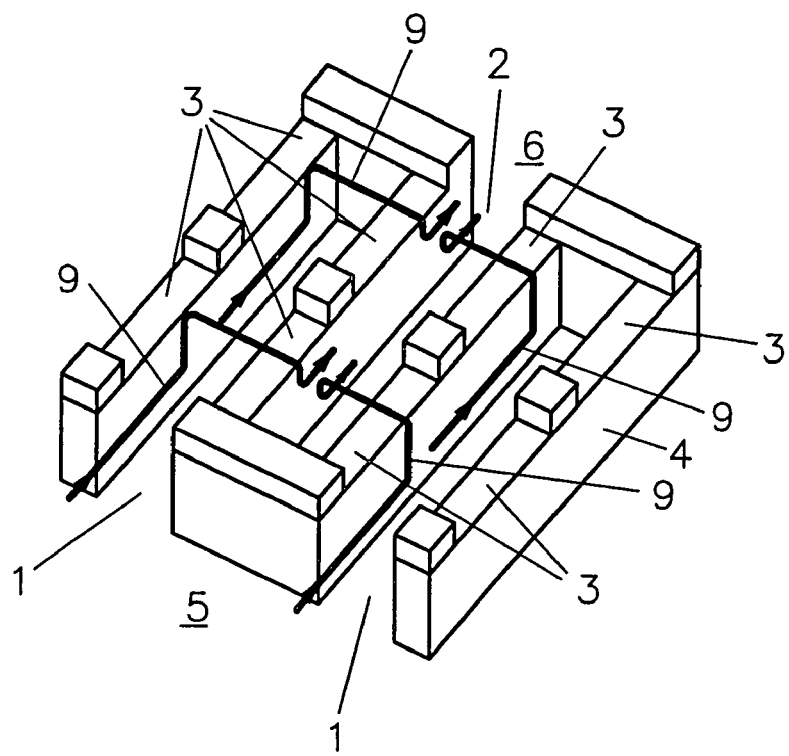
FIGS. 1a and 1b show the arrangement of the inlet and outlet structures in principle and the flow passages in a heat transfer wall in a perspective view and in a sectional top view of a first embodiment.
Figure 1B:
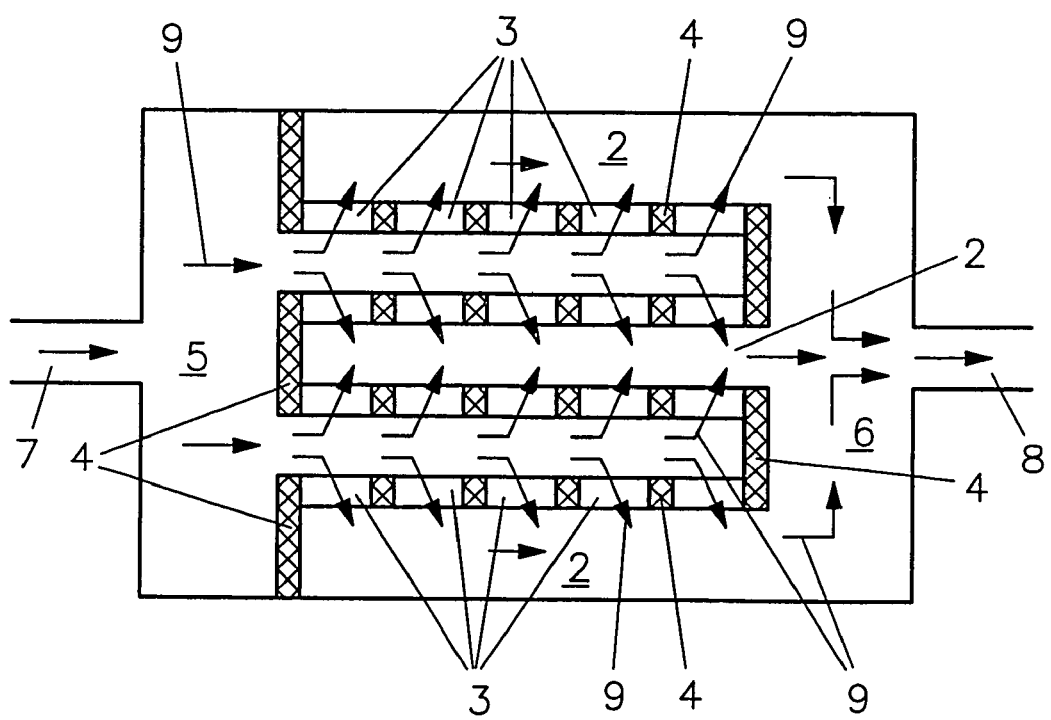

FIGS. 1a and 1b show, in principle, exemplary embodiments of the inlet duct structures 1, the outlet duct structures 2 and the passages 3 extending through the separating walls 4. The two inlet and outlet duct structures 1 and 2 are formed by alternately arranged duct structures 1 and 2 and are formed in the example by alternately arranged parallel channels, which are arranged in a plane of a distribution volume 5 for the inlet 7 and a collection volume 6 for the outlet 8. The separating walls have in the shown arrangement all about the same thickness over the whole length of the wall, wherein the bridging passages have for all passages, as far as possible, the same dimensions and are intercommunication only with the inlet and outlet structures 1, 2 not with the distribution and collection volumes for achieving equal or similar flow conditions. The flow directions of the heat transfer fluid through the arrangement are indicated by a number of arrows 9.

Other arrangements, for example meander-like or spirally intertwined passage structures may be considered but they also would need to satisfy the design criteria with regard to a desired laminar fluid flow in the duct structures 1, 2 and an advantageous turbulent flow in the heat exchange passages 4.

Figure 2A:
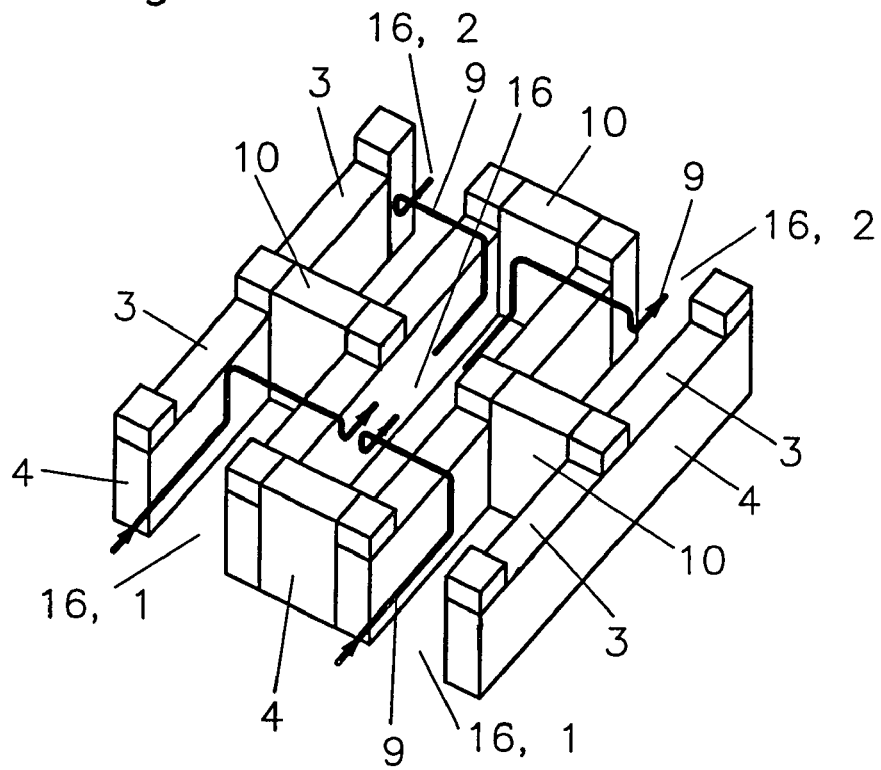
FIGS. 2a and 2b show the arrangement of the inlet and outlet structures in principle, and the flow passages of a second embodiment in a perspective view and in a sectional top view.
Figure 2B:
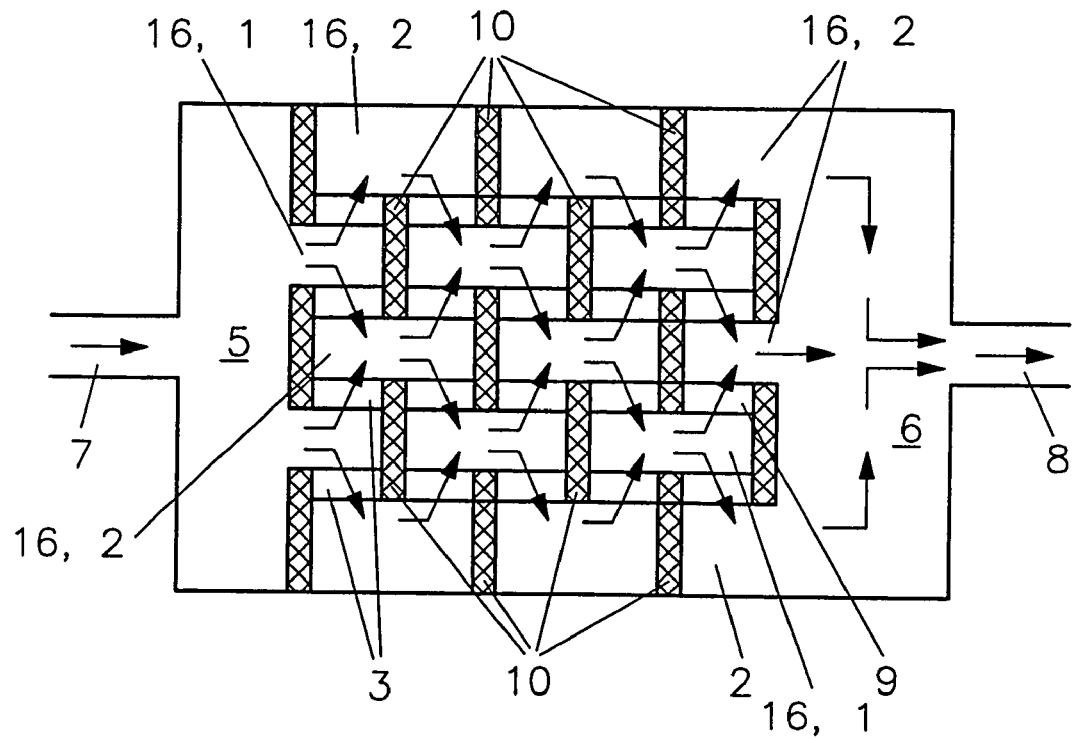

FIGS. 2a and 2b represent a second embodiment with the same views and reference numerals as used in FIGS. 1a and 1b. In contrast to the first embodiment, the heat transfer medium does not flow only through one passage but through several passages 4, one after the other. To this end, the duct structures 1, 2 are divided by fluid-tight barriers 10 into partial sections 16. The heat transfer medium switches during its flow through the arrangement repeatedly back and forth between the partial sections 16 of the duct structures 1, 2, wherein within each passage a heat amount is transferred to, or from, the heat transfer medium. It is not important and in any case considered to be within the scope of the present invention whether the inlet duct structure 1 and the outlet duct structure 2 are—as shown in FIG. 2a—arranged in alignment in the same channel but divided by barriers 10 while the adjacent passages with the partial sections 16 are closed at both ends and are in communication with the inlet and outlet duct structures 1, 2 only by way of the passages 3 or, as shown in FIG. 2b, the inlet and outlet duct structures 1 and, respectively, 2 are arranged—like in FIGS. 1a and 1b or also in FIGS. 3a and 3b in an alternating fashion. In the variant as shown in FIG. 2a, a part of the barriers 10 assumes the function of the separating walls 4. In each case, the temperature of the heat transfer medium changes with each flow through a passage. In contrast to the first embodiment wherein all the passages are intended to have the same or similar temperature conditions, the second embodiment is aimed at providing for a high thermal efficiency and a high area-specific performance with low flow resistance.

In FIGS. 1a and 1b and 2a and 2b, the heat transfer areas which are disposed at one or both sides of the shown arrangements correspond to those shown and are therefore not described.

Particularly in FIGS. 1a and 1b and also 2a and 2b, the preferred proportions of the passages 3 are shown. The length of the passages 3 corresponds to the bridging distance (thickness) of the walls 4. The passage cross-section is so dimensioned that, on one hand, the flow resistance is as low as possible but, on the other hand, as much as possible heat is transferred directly to the adjacent heat transfer areas 13 (see for example FIG. 4a) and not indirectly via additional elements such as cross-section delimitations arranged at a side or via cooling ribs. Consequently, the cross-section of the passages is selected so as to be as large as possible. In addition, the ratio width/height of the cross-section is as large as possible in order to obtain a large heat transfer with respect to the planar heat transfer areas, that is, the ratio is above 1 preferably above 3 or even 5. As shown in FIGS. 1a and 2a, the passages are delimited by webs (disposed on the walls 4 between the passages 3). They act like spacers with respect to the heat transfer areas not shown in FIGS. 1a and 2a and have a height corresponding to that of the passage cross-sections. They form side delimitations for the passages and represent basically a flow barrier. Consequently, these webs are small in their lateral extent, that is preferably not more than 50% of the width of the adjacent passages. Because of the desired large ratio of width/height of the passages the heat transfer occurs directly to the heat transfer area whereas only little heat is transferred via the side surface areas of the webs. Consequently, the webs are not conceived as cooling ribs to which the heat would be transferred and then conducted via the rib base, that is, indirectly to the heat transfer areas 13 (see FIG. 4a). As a result, different from cooling ribs, the webs have no important role in the transfer of the heat and therefore may consist of a material with low heat conductivity.

The small length, in comparison with the flow cross-section, of the multitude of passages provides in a parallel flow arrangement for a multitude of inlet flows. In inlet flows, with increasing distance from the inlet, a stationary flow condition with a heat insulating boundary is formed that is, with increasing length of a passage, the heat transfer efficiency decreases, but the flow resistance increases. Within a short length consequently a high heat transfer and a low flow resistance is achieved. The residence time of the heat transfer liquid as well as the Graetz number are very small which results in an increase of the Nusselt number. Because of the parallel arrangement of the passages and the short length of the passages the pressure losses are low. Typical dimensions of the passages are for example 0.05 to 0.2, preferably 0.1 to 0.15 mm, height, 0.5 to 1.5 mm, preferably 0.8 to 1.0 mm, width and 0.36 to 1.0 mm, preferably 0.5 to 0.6 mm, length of the passages or, respectively, thickness of the walls 4.

Figure 3A:
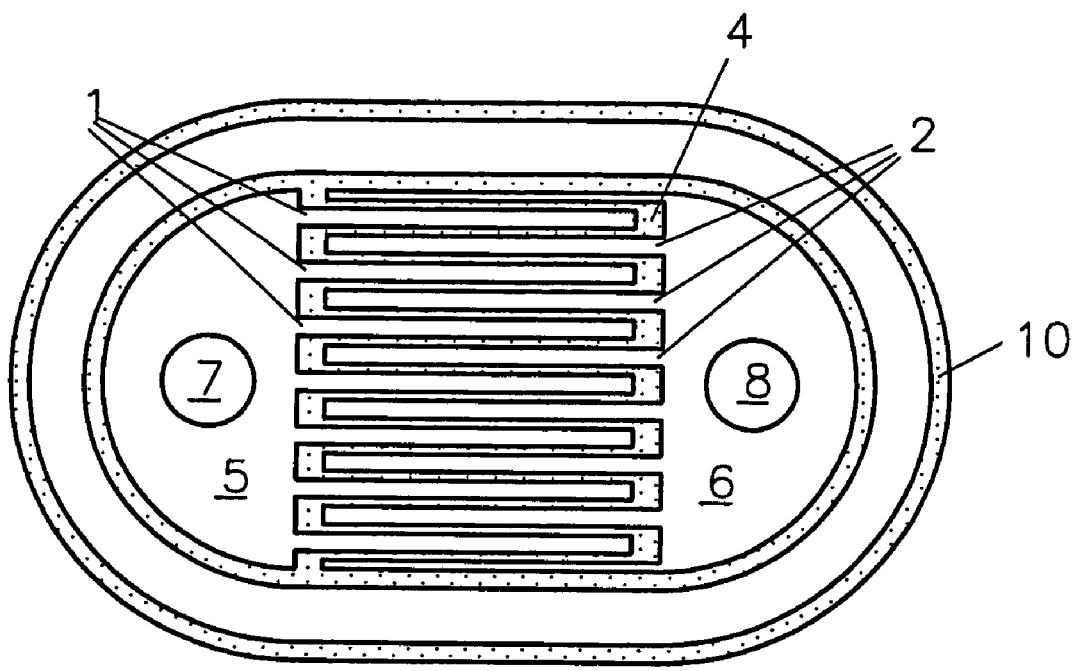
FIGS. 3a and 3b show components of a micro heat exchanger according to the first embodiment.
Figure 3B:
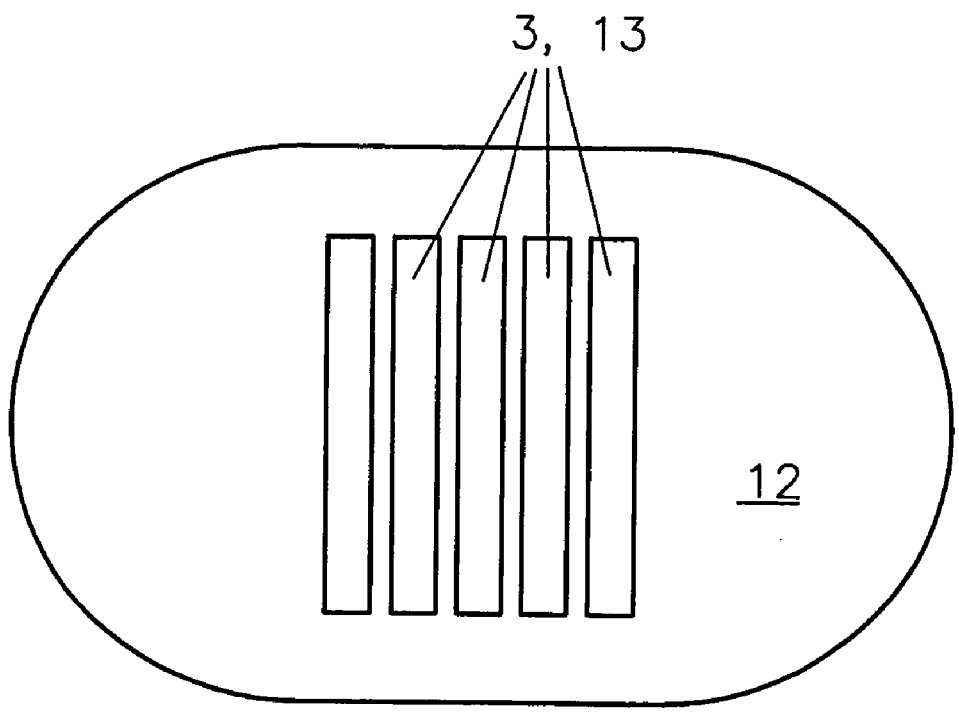

FIGS. 3a and 3b show the components of a micro heat exchanger with arrangements according to the first embodiment. The micro heat exchanger comprises the carrier plate 11 shown in FIG. 3a with the above-mentioned inlet and outlet duct structures 1 or, respectively, 2, the separating wall 4 and the distribution volumes 5, 6 in the form of machined-in recesses as well as inlet 7 and respectively, outlet 8 in the form of penetrations. In addition, the carrier plate includes at its circumference around the above-mentioned recesses a circumferential groove 14 for receiving a cement and/or sealing means for sealing a cover plate 11 (see FIGS. 4a and 4b) disposed thereon. The passages 3 are machined into the cover foil 12 as grooves extending normal to the inlet and outlet duct structures 1 and 2 (for example, mechanically) wherein the area of their extension forms the above-mentioned heat transfer area 13. The corresponding cross-section which extends normally through the duct structures 1 and 2 at the level of the passages 3 is shown in FIG. 4a.

Preferably, the carrier plate 11 consists of a material with low heat conductivity and the cover plate 12 consists of a material with good heat conductivity. This choice of materials has the advantage that the heat transfer in the passages occurs in the desired way while it is inhibited as far as possible in the inlet and outlet duct structures. Preferably, a heat insulating foil is disposed between the carrier plate and the cover foil which includes perforations coincident with the passages, and this heat insulating foil may furthermore be used for the welding of the carrier plate to the cover foil. In connection with the material pairing mentioned above however consideration must always be given to a different thermal expansion behavior and the tendency to shear tensions or relative movements, which complicates a durable jointure or which makes the earlier mentioned circumferential groove necessary for cementing or which requires compression. Alternatively, sideward sliding on the cover foil may be prevented by a form-fitting ridge extending into the circumferential groove 14 which in another embodiment may also be used as compression seat for the fitted jointure of the carrier plate and the cover foil.

Figure 4A:
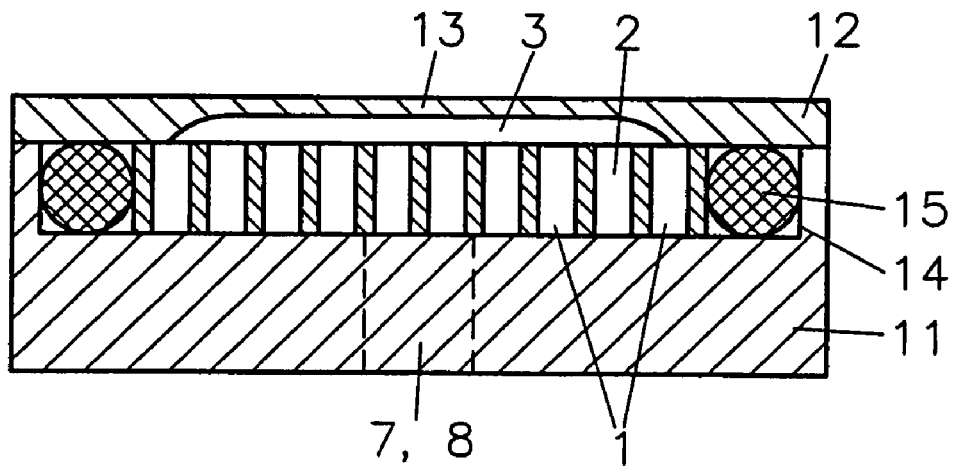
FIGS. 4a and 4b are sectional views of the micro heat exchanger of FIGS. 3a and 3b in sections normal to the inlet and outlet duct structures.
Figure 4B:
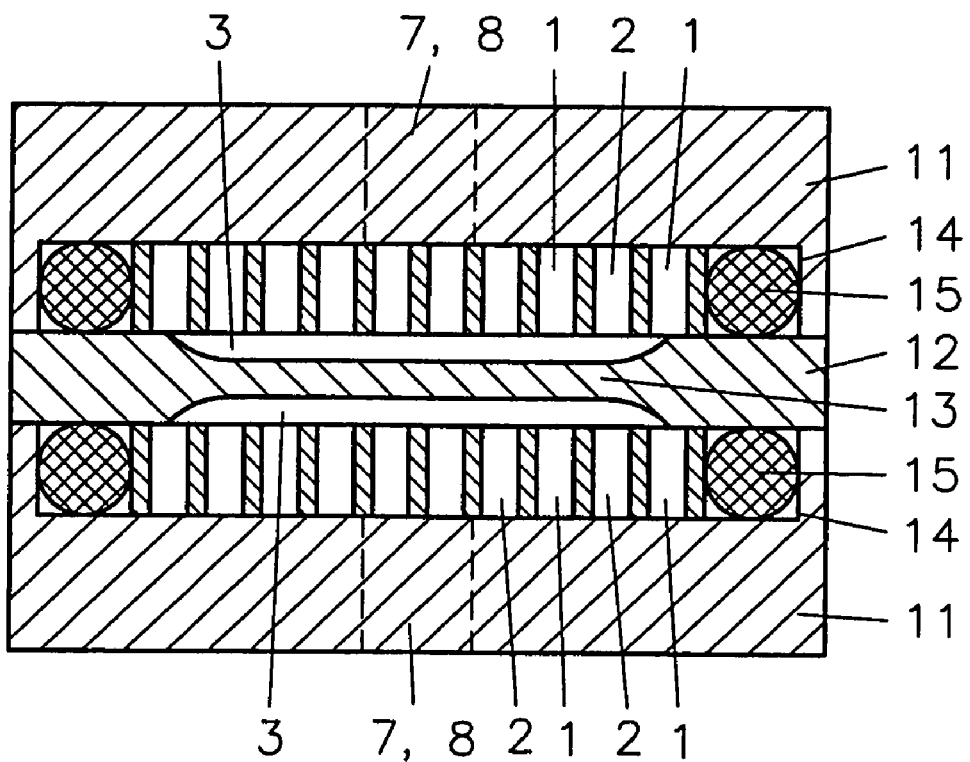

FIG. 4b shows a heat transfer area 13 with an arrangement of two oppositely arranged heat exchangers of the type described above. It is particularly suitable as a counter flow heat exchanger in connection with the second embodiment described above (see FIGS. 2a and 2b).

Figure 5:
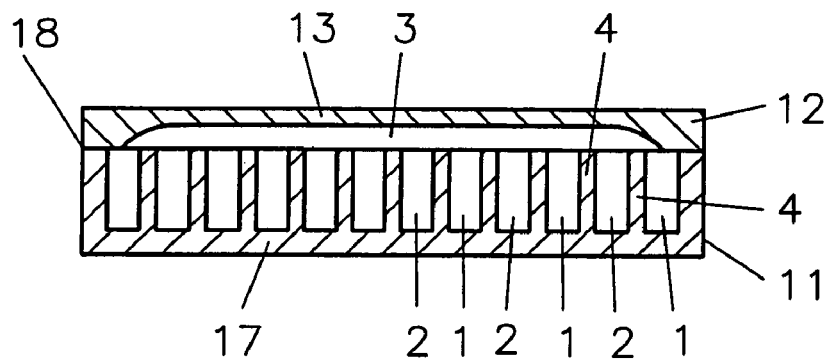
FIG. 5 is a cross-sectional view corresponding to FIGS. 4a and 4b of an alternative embodiment.

FIG. 5 on the other hand is a cross-sectional view similar to that of FIG. 4a of another embodiment. In this embodiment, no circumferential groove and no sealing means are provided to form a more compact structure. The carrier plate 11 and the cover foil 12 consist preferably of the same materials or materials which can thermally be joined preferably a metal, a metal alloy or a plastic and are joined in a fluid-tight manner preferably by diffusion welding. For avoiding excessive shear tensions at the joint 18, in this embodiment, the non-structured bottom area 17 of the carrier plate 11 is made as thin and therefore as elastically resilient as possible. Preferably, in this case, the height of the walls 4 and consequently the depth of the inlet and outlet structures 1 and 2 exceed twice the thickness of the bottom area. The inlet and outlets, not specifically shown in FIG. 5, do not need to penetrate the bottom area like in the embodiments shown in FIGS. 3 and 4 but may extend at the front ends through the carrier plate 11 or through the cover foil 12 of the micro heat exchanger.

Figure 6:
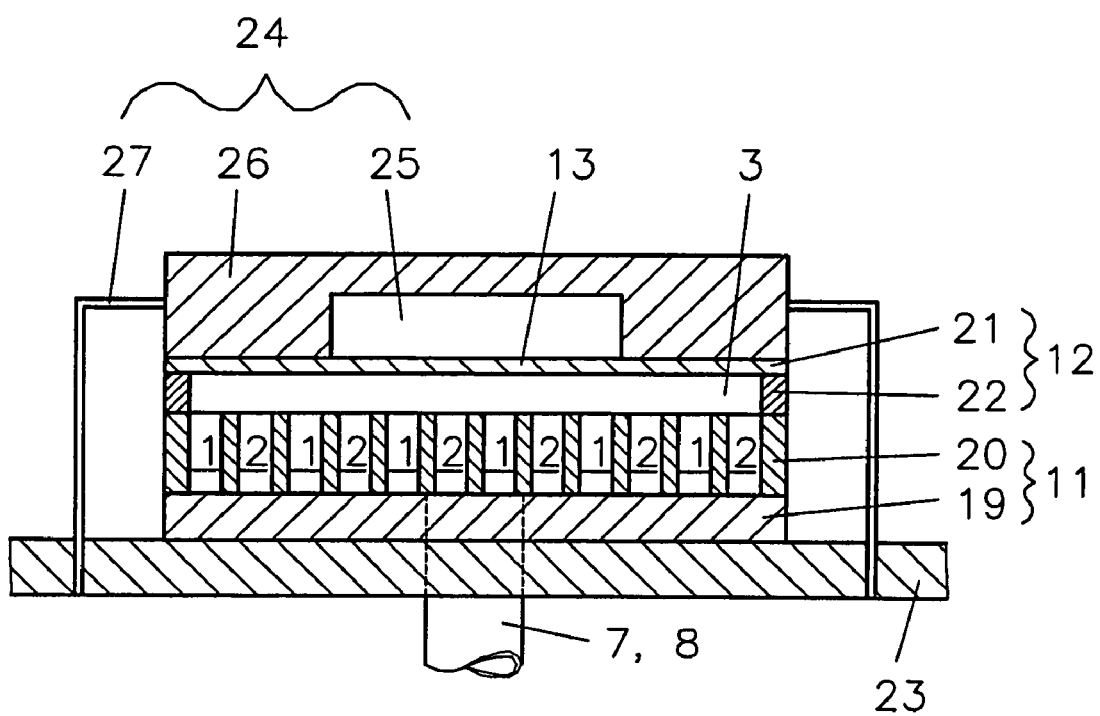
FIG. 6 is a sectional view corresponding to FIGS. 4a and 4b of an alternative arrangement for use as fluid coolers for electronic components on a circuit board, FIGS. 7a to 7d on top views of the structured foils of a micro heat exchanger in accordance with another embodiment.
Figure 7:
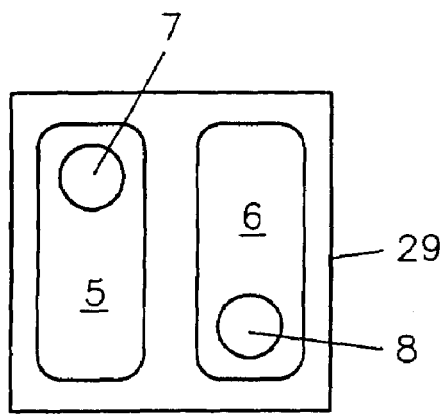
Figure 7:
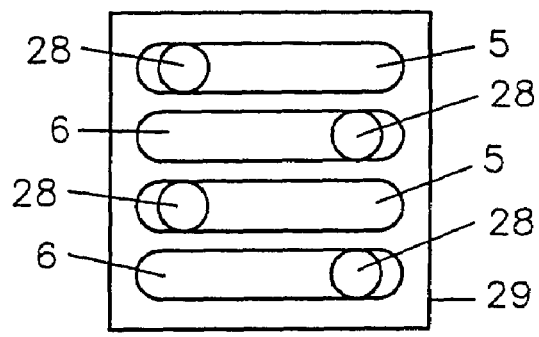
Figure 7:
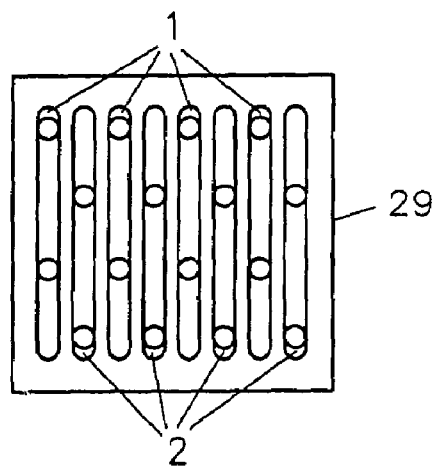
Figure 7:
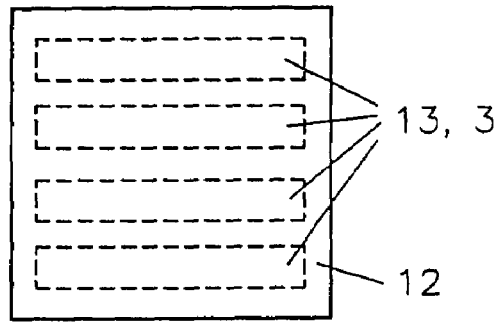

A sectional view corresponding to that of FIGS. 4a and 4b and 5 of an alternative design of the heat exchanger for use as a fluid cooler for electronic components on a conductor plate is shown in FIG. 6. The micro heat exchanger shown herein includes—in contrast to the embodiments described so far— only perforated structured or unstructured plates or foils. The carrier plate 11 is composed of a bottom plate 19 which is unstructured except for openings for the inlet 7 and the outlet 8 (corresponding to the bottom area) and a structured plate 20 which is disposed on the bottom plate 19 and includes in the area of the inlet duct structure 1, the outlet duct structure 2 and the distribution volumes 5 and 6 for the inlet 7 and, respectively, the outlet 8. Similarly, the cover foil 12 comprises an unstructured heat conducting foil 21 and a structured foil 23 provided with opening in the area of the passages. The arrangement of the openings in the structured foil and the structured plate follows the earlier mentioned design consideration for the fluid cylinder structures (channels structures with wall passages, distribution volumes, etc.) in the described embodiments and are shown in an exemplary form in FIGS. 3a and 3b. Also, in this case for example a diffusion welding process is an expedient procedure for joining the layers of the micro heat exchanger.

For a use as fluid cooler for electronic components the micro heat exchanger shown in FIG. 6 is disposed on a plate 23 wherein the inlet 7 and the outlet 8 extend through the plate 23. It is also possible to integrate the inlet and the outlet into channels provided in a multi-layer plate. The electronic component 24 itself comprises an electronic circuit 25 such as a processor which generates the heat to be removed and which is disposed directly on the heat conductive foil 21. The electronic component comprises further a housing 26 and electronic contact structure 27 for the connection of the circuit to the conductor strip of the plate.

FIGS. 7a to 7d and FIG. 8 show a second embodiment of the micro heat exchanger. Important therein is that the inlet duct structure 1 and the outlet duct structure 2 together with the respective distribution volumes 5, 6 extend over at least two, in the exemplary embodiment shown three, planes. Like in the earlier mentioned embodiment variants, the heat transfer area 13 and the passages 3 are integrated into the cover foil 12 (see top view of FIG. 7d and sectional view of FIG. 8, top). The design and the effect of the passages and the heat transfer area, which for an effective heat transfer is relatively thin, have also been conceived in accordance with the criteria described earlier. Like in the earlier exemplary embodiments, a foil 29 with the inlet duct structure 1 and the outlet duct structure 2 and with a plurality of parallel passages (see FIG. 7c) is arranged below the cover foil 29. The inlet and outlet duct structures are in the form of passages which are intertwined in alternate order. The passages 3 in the cover foil 12 and the inlet duct structure 1 and the outlet duct structure 2 in the foil 29 extend preferably at right angles to the respective open passage structures (see FIGS. 7c and d and FIG. 8).

Figure 8:
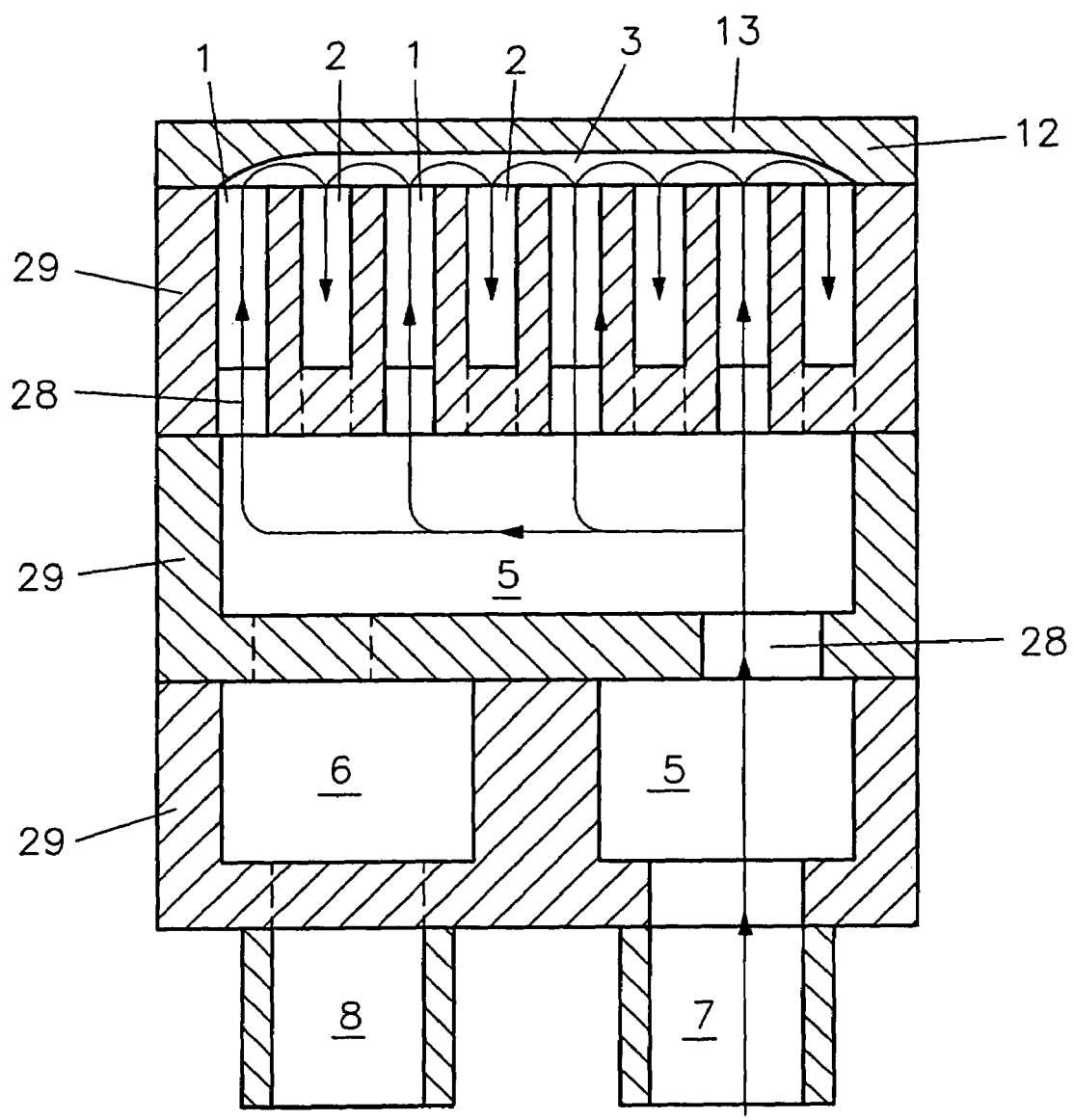
FIG. 8 is a cross-sectional view of the embodiment of FIGS. 7a to 7d.

In contrast to the above described embodiments, the distribution volumes 5 and 6 for the inlet 7 and, respectively, the outlet 8 are not arranged in a plane at the side of the duct structures 1 and 2, but in at least one separate plane below the plane with the duct structures 1 and 2. Like the duct structures 1, 2, they preferably consist each of a metal foil 29 into which the ducts are formed. The ducts in each foil, that is, in each plane, are—as shown in FIGS. 7a-7c and 8—arranged preferably in parallel relationship and in alternate order with regard to their association with the inlet or, respectively, the outlet. All duct structure in the foils have communication openings 28, that is, openings in the foils 29 in the bottom areas of the ducts, which connect the respective underlying distribution volumes selectively only with the respective distribution volumes with the same association to the inlet 7 or, respective the outlet 8. A heat transfer medium such as water or oil flows accordingly, after passing through the inlet structure, through all the planes and, after flowing through the passages 3, enters the particular passage associated with the outlet 8. Via these passages, the medium is conducted through all planes in the opposite direction to the outlet 8 (see FIG. 8). The flow path from the inlet via the distribution volumes (inlet distribution volume 5 with passages through the communication openings 28), the inlet duct structure 1, and the passages 3 up to the outlet duct structure 2 is indicated in FIG. 8 in an exemplary fashion by the branching arrows.

A feature of this embodiment resides in the layout of the passages in the various planes. The passages extend (see FIGS. 7a-7c) preferably at right angles with respect to those in the respective adjacent planes, which include foils or planes which, in the direction of the heat transfer area 13, have an increasing number of passages with decreasing diameters. In each plane, the passages are arranged in alternative order preferably parallel to one another (see FIGS. 7a-7c) and are in communication each via the connecting openings 28 with the respective passages of the inlet structure and, respectively, the outlet structure.

The first of the foils 29 and the cover foil 12 disposed thereon comprise the actual heat transfer structure whereas the remaining foils 29 disposed underneath comprise the distribution volumes. The foils consist preferably of a metal which is corrosion resistant to the coolant such as water (for example, VA steel, brass etc.) and are joined by a diffusion welding method.

The particular advantage of this second embodiment resides in the simple scalability of the design. The inlet and outlet of the micro heat exchanger is branched with each plane, that is, by additions or omissions practically any desired branching with fine branching differentiations can be realized.

By the very short heat travel distances for the cooling medium through the heat transfer area 13 from the component to be cooled without redirections through other components such as cooling ribs all the variants of the micro heat exchanger according to the invention have the particular advantage, that the material in the heat transfer area does not necessarily have to have a good heat conductivity and can therefore be selected for improved corrosion resistance and greater life expectancy.

Basically, the spectrum of materials usable for this micro heat exchanger does not only comprise corrosion-resistant metals but also other materials such as glass, plastics, or ceramics.

What is claimed is:

1. A micro heat exchanger for the transfer of high area-specific amounts of heat from a heat source to a heat transfer medium comprising:
   a) a heat transfer structure with
   b) an inlet duct structure (1) and an outlet duct structure (2) each having a distribution volume (5, 6) with an inlet (7) and an outlet (8), respectively, for conducting a heat transfer medium through the micro heat exchanger, the distribution volumes (5, 6) being in communication with the inlet and outlet ducts (1, 2) formed by opposite spaced walls (4) having a large height-to-width ratio, a cover (13) of a heat conducting material forming a heat transfer area, the walls between the inlet and the outlet flow duct structures having adjacent the cover (13) narrow transverse flow passages (3) of a flow cross-section which is small when compared with the flow cross-section of the inlet and outlet duct structures (1, 2), so that a flow medium has a low speed with little pressure loss in the inlet and outlet duct structures (1, 2) but flows at high speed through the relatively short narrow flow passages (3) where the flow medium flows along the cover (13) of heat ducting material for high heat transfer between the cover (13) and the flow medium,
   c) the narrow flow passages (3) extending between the inlet and outlet duct structures (1, 2) forming the only communication paths between the inlet and outlet duct structures (1, 2) for the heat transfer medium, and d) said inlet and outlet duct structures (1, 2) being arranged intertwined in an alternating order in the transfer area in close proximity to the heat source extending over the whole cover area.

2. The micro heat exchanger according to claim 1, comprising only one inlet- and outlet duct structure (1, 2) for one heat transfer medium, wherein the heat transfer cover (13) is formed by a heat transfer outer area.

3. The micro heat exchanger according to claim 1, wherein the inlet- and outlet duct structures (1, 2) are divided by barriers (10) into partial sections (16) and each partial section (16) is in communication with two adjacent partial sections by way of transverse flow passage (3).

4. The micro heat exchanger according to claim 1, wherein the inlet and outlet duct structures (1, 2) form each together with a distribution volume (5, 6) a planar comb-shaped passage structure for each heat transfer medium, wherein the comb-shaped passage structures are arranged in a common plane and the transverse flow passages connected to inlet- and, respectively, outlet duct structures (1, 2) are arranged alternately in parallel relationship.

5. The micro heat exchanger according to claim 4, wherein the inlet duct structure (1) and the outlet duct structure (2) are arranged together with the respective distribution volumes (5, 6) in passage groups with association to the respective inlet (7) and outlet (8) in several planes.

6. The micro heat exchanger according to claim 5, wherein the passage groups include in each plane an—in the direction of the heat exchange area (13)—increasing number of passages which are arranged in alternating order and parallel to one another and are in communication with communication openings (28) in communication with the respective passage groups with the same association with inlets and, respectively, outlets in the adjacent planes.

7. The micro heat exchanger according to claim 5, wherein the planes are formed by plates or foils (29) with groups of passages formed from one side into the plates or foils (29) and with opening (28) providing for communication with the passages.

8. The micro heat exchanger, according to claim 1, wherein the inlet duct and outlet duct structures (1, 2) are formed for each heat transfer medium from one side into a carrier plate (11) as groove-like recesses and are sealingly covered by a cover foil (12) and the passages (3) are groove-like recesses formed into the cover foil, and the cover foil forms the heat transfer area (13).

9. The micro heat exchanger according to claim 8, wherein the cover foil passages extend normal to the grooves of the carrier plate.

10. The micro heat exchanger according to claim 8, wherein the micro heat exchanger is associated with an electronic component which is disposed on the heat transfer area (13) for the transfer of the heat generated by the electronic component to the heat transfer medium.

* * * * *